United States Patent
Phan et al.

(10) Patent No.: US 6,208,554 B1
(45) Date of Patent: Mar. 27, 2001

(54) SINGLE EVENT UPSET (SEU) HARDENED STATIC RANDOM ACCESS MEMORY CELL

(75) Inventors: Ho Gia Phan, Centreville, VA (US); Derwin Jallice, Austin, TX (US); Bin Li, Fairfax, VA (US); Joseph Hoffman, Chandler, AZ (US)

(73) Assignee: Lockheed Martin Corporation, Bethesda, MD (US)

( * ) Notice: Subject to any disclaimer, the term of this patent is extended or adjusted under 35 U.S.C. 154(b) by 0 days.

(21) Appl. No.: 09/441,942

(22) Filed: Nov. 17, 1999

Related U.S. Application Data

(60) Provisional application No. 60/136,479, filed on May 28, 1999.

(51) Int. Cl.⁷ .................................................. G11C 11/00
(52) U.S. Cl. ................................. 365/154; 365/181
(58) Field of Search .................. 365/154, 103, 365/133, 226, 177, 181

(56) References Cited

U.S. PATENT DOCUMENTS

| | | | |
|---|---|---|---|
| 4,169,233 | * 9/1979 | Haraszti | 307/355 |
| 4,809,226 | 2/1989 | Ochoa, Jr. | 365/156 |
| 4,912,675 | 3/1990 | Blake et al. | 365/154 |
| 4,914,629 | 4/1990 | Blake et al. | 365/154 |
| 4,956,814 | 9/1990 | Houston | 365/154 |
| 5,111,429 | 5/1992 | Whitaker . | |
| 5,135,882 | 8/1992 | Karniewicz | 438/385 |
| 5,157,625 | * 10/1992 | Barry | 365/154 |
| 5,307,142 | 4/1994 | Corbett et al. | 365/156 |
| 5,311,070 | * 5/1994 | Dooley | 307/311 |
| 5,315,545 | 5/1994 | Guo et al. | 365/156 |
| 5,367,482 | 11/1994 | Guo et al. | 365/156 |
| 5,406,513 | 4/1995 | Canaris et al. | 365/181 |
| 5,504,703 | 4/1996 | Bansal | 365/156 |
| 5,525,923 | 6/1996 | Bialas, Jr. et al. | 327/210 |
| 5,699,305 | 12/1997 | Kawashima . | |
| 5,862,089 | 1/1999 | Raad et al. | 365/203 |

FOREIGN PATENT DOCUMENTS

| | | |
|---|---|---|
| 0357980A2 | 3/1990 | (EP) . |
| 0432846A1 | 6/1991 | (EP) . |

* cited by examiner

*Primary Examiner*—David Nelms
*Assistant Examiner*—Thong Le
(74) *Attorney, Agent, or Firm*—Felsman, Bradley, Vaden, Gunter & Dillon

(57) ABSTRACT

A single event upset hardened memory cell to be utilized in static random access memories is disclosed. The single event upset hardened memory cell includes a first set of cross-coupled transistors, a second set of cross-coupled transistors, a first set of isolation transistors, and a second set of isolation transistors. The first and second sets of isolation transistors are coupled to the first and second set of cross-coupled transistors, respectively, such that two inversion paths are formed between the cross-coupled transistors and the isolation transistors.

35 Claims, 6 Drawing Sheets

SINGLE EVENT UPSET (SEU) HARDENED STATIC RANDOM ACCESS MEMORY CELL

RELATED PATENT APPLICATION

This application claims the benefit of U.S. Provisional Ser. No. 60/136,479 filed May 28, 1999.

The present patent application is related to copending application U.S. Ser. No. 09/441,941, filed on even date, entitled "METHOD AND APPARATUS FOR HARDENING A STATIC RANDOM ACCESS MEMORY CELL FROM SINGLE EVENT UPSETS".

BACKGROUND OF THE INVENTION

1. Technical Field

The present invention relates to integrated circuits in general, and in particular to bi-stable integrated circuits. Still more particularly, the present invention relates to a single event upset hardened memory cell to be utilized in static random access memories.

2. Description of the Prior Art

In certain environments, such as satellite orbital space, in which the level of radiation is relatively intense, electronic devices that utilize static random access memories (SRAMs) are more susceptible to single event upsets (SEUs) or soft errors. These SEUs are typically caused by electron-hole pairs created by, and travelling along the path of, a single energetic particle as it passes through the memory cells of the SRAMs. Should the energetic particle generate a critical charge within a storage node of an SRAM cell, the logic state of the SRAM cell will be upset. Thus, the critical charge is the minimum amount of electrical charge required to change the logic state of the SRAM cell.

Referring now to the drawings and in particular to FIG. 1, there is illustrated a schematic diagram of a conventional memory cell that is typically used in SRAMs. Memory cell 10 is constructed with two cross-coupled complementary metal oxide semiconductor (CMOS) inverters 17 and 18. As shown, inverter 17 includes a p-channel transistor 11 and an n-channel transistor 12, and inverter 18 includes a p-channel transistor 13 and an n-channel transistor 14. The gates of transistors 11 and 12 are connected to the drains of transistors 13 and 14, and the gates of transistors 13 and 14 are connected to the drains of transistors 11 and 12. This arrangement of inverter 17 and inverter 18 is commonly referred to as cross-coupled inverters, and the two lines connecting the gates and the drains of inverters 17 and 18 are commonly referred to as cross-coupling lines. An n-channel pass transistor 15, having its gate connected to a wordline WL, is coupled between a bit line BL and a node S1. Similarly, an n-channel pass transistor 16, also having its gate connected to wordline WL, is coupled between a bit line $\overline{BL}$ and a node S2. When enabled, pass transistors 15, 16 allow data to pass in and out of memory cell 10 from bit lines BL and $\overline{BL}$, respectively. Pass transistors 15, 16 are enabled by wordline WL, which has a state that is a function of the row address within an SRAM. The row address is decoded by a row decoder (not shown) within the SRAM such that only one out of n wordlines is enabled, where n is the total number of rows of memory cells in the SRAM.

During operation, the voltages of nodes S1 and S2 are logical complements of one another, due to the cross-coupling of inverters 17 and 18. When wordline WL is energized by the row decoder according to the row address received, pass transistors 15 and 16 will be turned on, coupling nodes S1 and S2 to bit lines BL and $\overline{BL}$, respectively. Accordingly, when wordline WL is high, the state of memory cell 10 can establish a differential voltage on BL and $\overline{BL}$.

The logic state of memory cell 10 can be changed by an SEU in many ways. For example, if a single energetic particle, such as an alpha particle, strikes the drain of p-channel transistor 11 of inverter 17, electrons will diffuse towards a power supply $V_{dd}$ of inverter 17, and holes collected at the drain will change the output voltage of inverter 17 at node S1 from a logic low to a logic high when n-channel transistor 12 is on and p-channel transistor 11 is off. However, if the alpha particle strikes the drain of n-channel transistor 12 of inverter 17, holes will drift towards ground, and electrons collected at the drain will change the output voltage of inverter 17 at node S1 from a logic high to a logic low when p-channel transistor 11 is on and n-channel transistor 12 is off.

According to the prior art, one method of hardening a memory cell, such as memory cell 10, against SEU is by reducing the amount of charges generated by a given particle strike. This is typically accomplished by using a silicon film thinner than the collection depth in bulk semiconductor. For example, an SRAM cell created on a thin film on an insulator, such as silicon on insulator (SOI), is much less susceptible to SEUs than an SRAM cell created on a bulk silicon because ionization charge along a path in an insulator is more likely to recombine than to be collected compared to ionization charge created in a bulk silicon. However, the processing cost of SOI is much higher than bulk silicon; thus, SOI is generally not the most preferable method. But as the number and density of memory cells and logic circuits within an integrated circuit device have rapidly grown over the years, SEU error rate has become an alarming problem that cannot be ignored, even for application environments in which the level of radiation is relatively low.

Another way to reduce the susceptibility of a memory cell, such as memory cell 10, to SEUs is by increasing the critical charge of the memory cell. With reference now to FIG. 2, there is illustrated a schematic diagram of an SEU-hardened SRAM cell using a resistive approach, in accordance with the prior art. The SEU hardening scheme for SRAM cell 20 is based on increasing the critical charge required to produce SEUs, and that is accomplished by increasing the resistance of the cross-coupling lines of the cross-coupled inverters from FIG. 1. FIG. 2 illustrates the same circuit as shown in FIG. 1 with the exception that resistors R1 and R2 are included in the cross-coupling lines of inverters 17 and 18. The purpose of resistors R1 and R2 is to increase the RC time constant delay associated with the gate capacitances of transistors 11–14. The initial effect of an energetic particle strike to a node of SRAM cell 20, say node S1, is to change the voltage of node S1. Upset will occur if this voltage change propagates through the cross-coupling of inverters 17 and 18 before the initial voltage of node S1 can be restored. The increased RC delay can slow the feedback propagation through the cross-coupling and allows more time for recovery of the initially affected node S1. But this increase in RC propagation delay also slows the write cycle time of SRAM cell 20. Because the write cycle of SRAMs has typically been faster than the read cycle, some slowing of the write cycle has been viewed as acceptable, especially since the read cycle time is usually more performance critical. However, as memory cells are scaled to smaller geometries, the speed of the write cycle of SRAM cells becomes more critical than in previous SRAM designs. In addition, it is very difficult to control process parameters under the resistive approach. As a result, the resistive approach to SEU hardening is no longer desirable for SRAMs.

Yet another way to reduce the susceptibility of a memory cell to SEU is to increase the capacitance on the drains of inverters 17 and 18 of memory cell 10 from FIG. 1, thus decreasing the voltage change on a node for a given amount of collected charge. Referring now to FIG. 3, there is illustrated a schematic diagram of an SEU-hardened SRAM cell using a capacitive approach in accordance with the prior art. FIG. 3 illustrates the same circuit as shown in FIG. 1 with the exception that a capacitor C is connected across the drains of inverters 17 and 18. By having capacitor C located between the gate and drain of inverters 17 and 18, the effective capacitance is increased by the Miller effect. Also, with capacitor C connected between the gate and drain, a change in the drain voltage will induce a change in the gate voltage such that restoring current is increased. Furthermore, the increased capacitance on the gate will increase the RC delay in the feedback path, thus increasing the resistance to SEUs as well as retarding changes in logic state. However, the capacitive approach to SEU hardening is not very practical because it slows down the speed of the memory cell. Thus, it is desirable to provide an improved SEU hardened memory cell for SRAMs that can easily be fabricated with the conventional complementary metal oxide semiconductor (CMOS) technology.

SUMMARY OF THE INVENTION

In accordance with a preferred embodiment of the present invention, a single event upset hardened memory cell includes a first set of cross-coupled transistors, a second set of cross-coupled transistors, a first set of isolation transistors, and a second set of isolation transistors. The first and second sets of isolation transistors are coupled to the first and second set of cross-coupled transistors, respectively, such that two inversion paths are formed between the cross-coupled transistors and the isolation transistors.

All objects, features, and advantages of the present invention will become apparent in the following detailed written description.

BRIEF DESCRIPTION OF THE DRAWINGS

The invention itself, as well as a preferred mode of use, further objects, and advantages thereof, will best be understood by reference to the following detailed description of an illustrative embodiment when read in conjunction with the accompanying drawings, wherein.

DETAILED DESCRIPTION OF A PREFERRED EMBODIMENT

Figure 1:
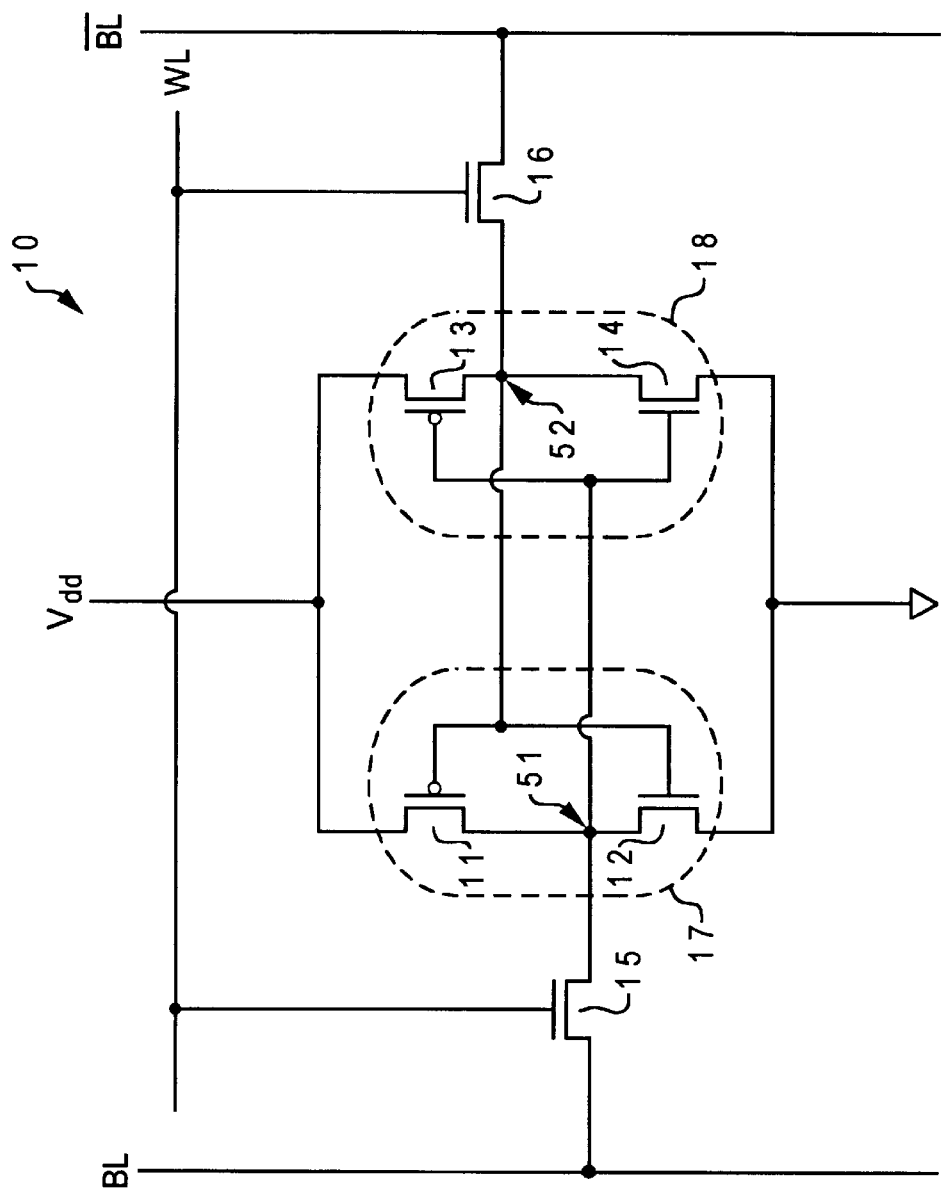
FIG. 1 is a schematic diagram of a conventional memory cell that is typically used in a static random access memory (SRAM)
Figure 2:
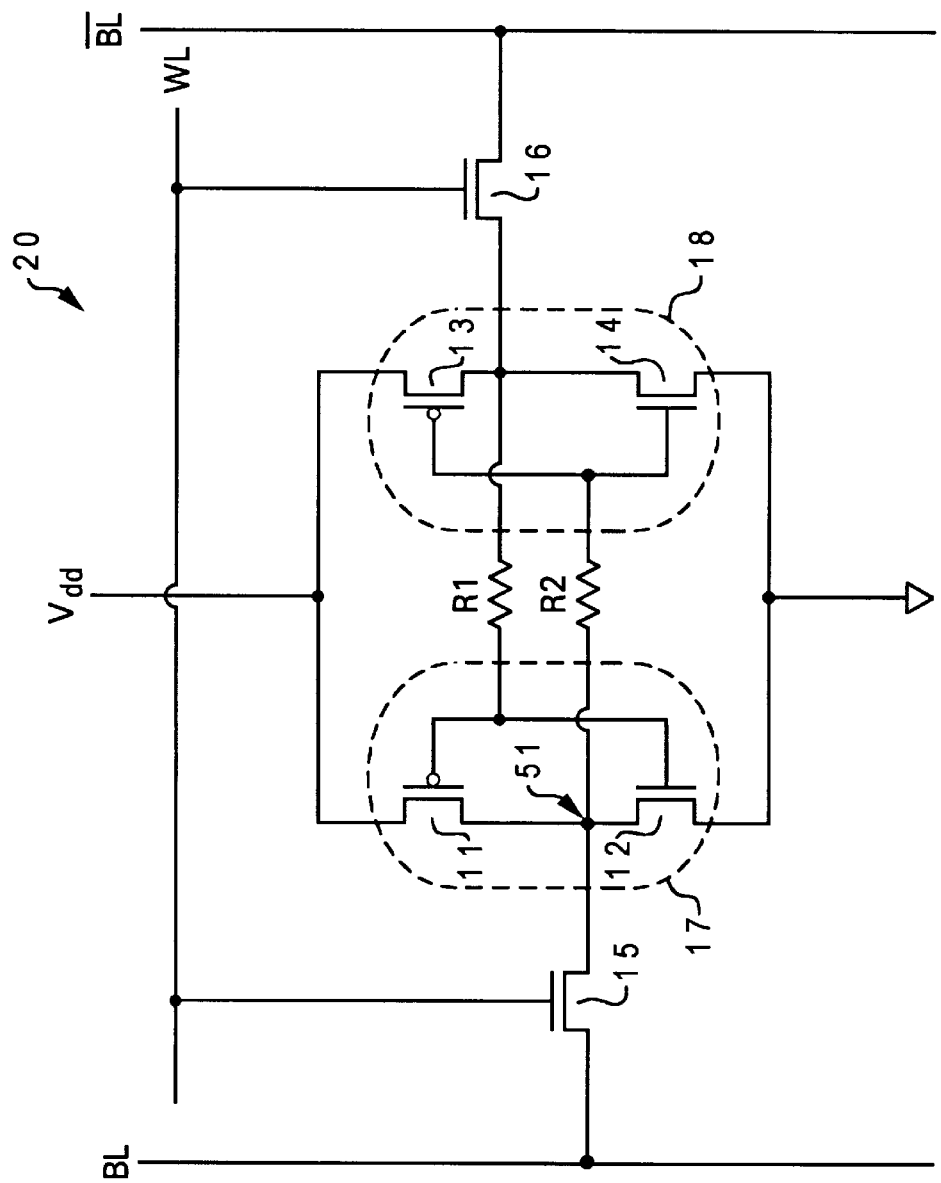
FIG. 2 is a schematic diagram of a single event upset (SEU) hardened SRAM cell using a resistive approach, in accordance with the prior art.
Figure 3:
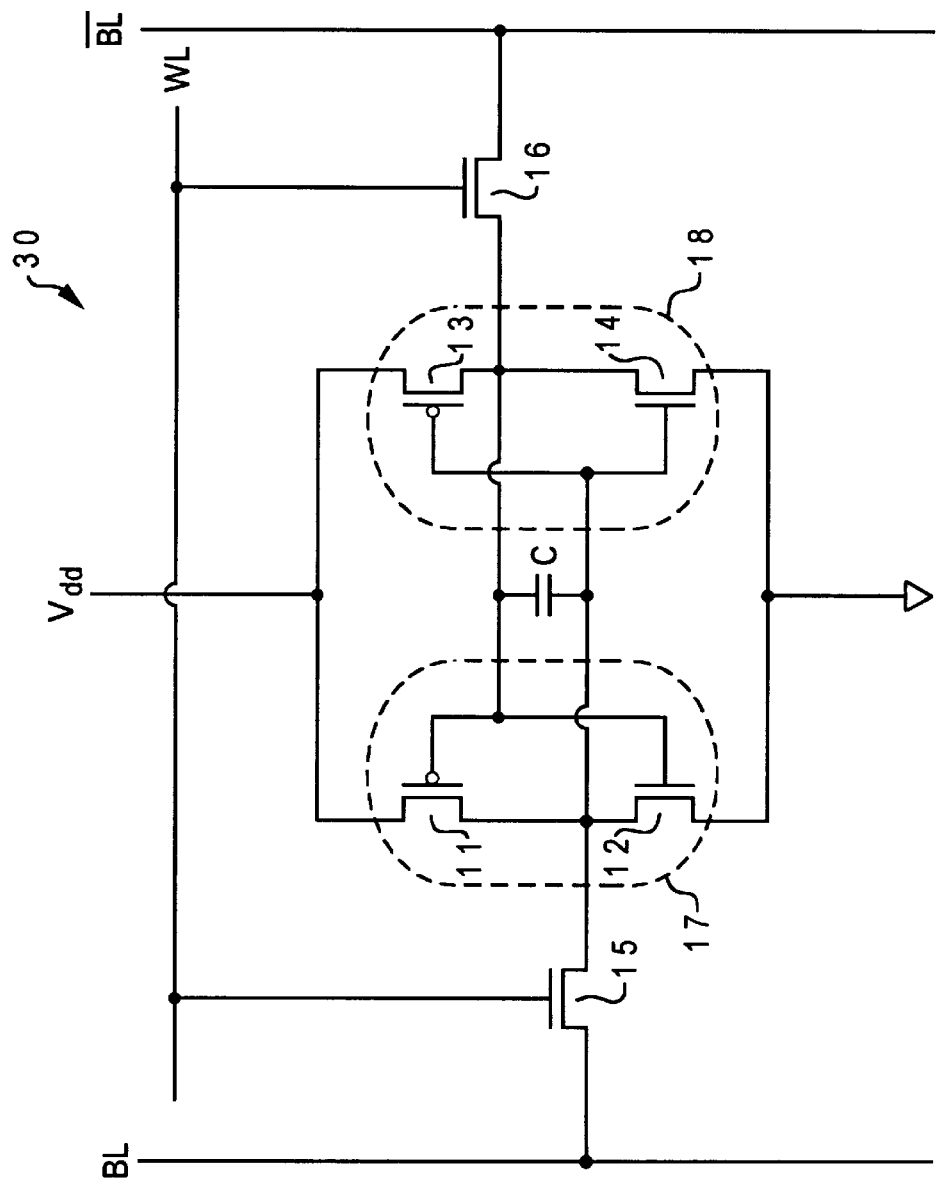
FIG. 3 is a schematic diagram of an SEU-hardened SRAM cell using a capacitive approach, in accordance with the prior art.
Figure 4:
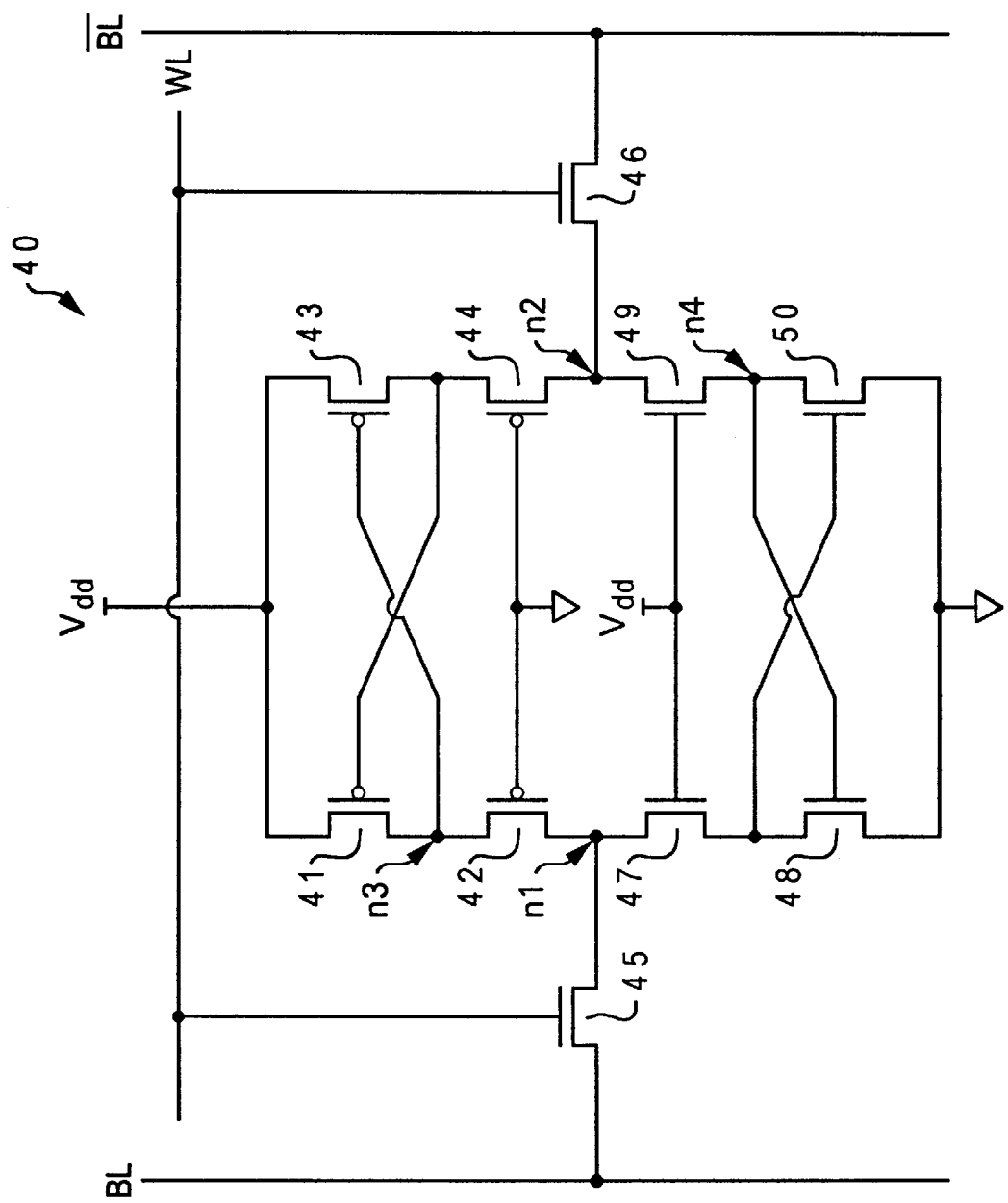
FIG. 4 is a schematic diagram of an SEU-hardened SRAM cell in accordance with a preferred embodiment of the present invention.

With reference now to FIG. 4, there is illustrated a schematic diagram of an SEU-hardened SRAM cell in accordance with a preferred embodiment of the present invention. As shown, an SRAM cell 40 includes p-channel transistors 41–44 and n-channel transistors 47–50. Transistors 41, 42, 47, and 48 are connected in series, with the source of transistor 41 connected to a power supply, $V_{dd}$, and transistor 48 connected to ground. Similarly, transistors 43, 44, 49, and 50 are connected in series, with the source of transistor 43 connected to $V_{dd}$ and transistor 50 connected to ground.

In addition, transistors 41, 42 are cross-coupled to transistors 43, 44, and transistors 47, 48 are cross-coupled to transistors 49, 50. For transistors 41–44, the cross-coupling is accomplished by connecting the gate of transistor 41 to a node between transistors 43 and 44, and by connecting the gate of transistor 43 to a node between transistors 41 and 42. For transistors 47–50, the cross-coupling is accomplished by connecting the gate of transistor 48 to a node between transistors 49 and 50, and by connecting the gate of transistor 50 to a node between transistors 47 and 48.

As a preferred embodiment of the present invention, the gates of transistors 42 and 44 are connected to a low voltage, such as ground; while the gates of transistors 47 and 49 are connected to a high voltage, such as a power supply $V_{dd}$. Thus, transistors 42 and 47 function as isolation transistors for transistors 41 and 48, respectively. Similarly, transistors 44 and 49 function as isolation transistors for transistors 43 and 50, respectively. As a result, two inversion paths are formed. The first inversion path includes transistors 41, 44, 49, and 48; and the second inversion path includes transistors 43, 42, 47, and 50.

Also shown in FIG. 4 is two n-channel pass transistors 45 and 46. Pass transistor 45, having its gate connected to a wordline WL, is coupled between a bit line BL and a node n1. Similarly, pass transistor 46, also having its gate connected to wordline WL, is coupled between a bit line $\overline{BL}$ and a node n2. When enabled, pass transistors 45, 46 allow data to pass in and out of SRAM cell 40 from bit lines BL and $\overline{BL}$, respectively. Pass transistors 45, 46 are enabled by wordline WL, which has a state that is a function of the row address in an SRAM, as is understood by those skilled in the relevant art.

During operation, the voltages of nodes n1 and n2 are logical complements of one another. When wordline WL is energized by the row decoder according to the row address received, pass transistors 45 and 46 will be turned on, coupling nodes n1 and n2 to bit lines BL and $\overline{BL}$, respectively. Accordingly, when wordline WL is high, the state of SRAM cell 40 can establish a differential voltage on BL and $\overline{BL}$. The sizes of transistors 41–44 and 47–50 are generally chosen such that when pass transistors 45 and 46 are turned on by wordline WL, a differentially low voltage at bit line BL with respect to bit line $\overline{BL}$ can force node n2 to a logic high state, and a differentially low voltage at bit line $\overline{BL}$ with respect to bit line BL can force node n1 to a logic high state. In addition, the sizes of transistors 41–44 and 47–50 are also chosen such that when pass transistors 45 and 46 are turned on by wordline WL, a differentially high voltage at bit line BL with respect to bit line $\overline{BL}$ will not force node n2 high, nor will a differentially high voltage at bit line $\overline{BL}$ with respect to bit line BL force node n1 high. Therefore, writing into SRAM cell 40 is accomplished by "pulling" the desired bit line and thus the desired side of SRAM cell 40 at either node n1 or node n2 low, which in turn (due to feedback paths in SRAM cell 40) causes the opposite side of SRAM cell 40 to have a logic high state.

The width-to-length ratios of transistors 42, 44 and 47, 49 are carefully chosen to assist in the protection against high energy particle upset. Transistors 42, 44 are much smaller in comparison to the cross-coupled transistors 41, 43. Thus, a significant amount of voltage can be dropped across each of transistors 42 and 44 with respect to cross-coupled transistors 41 and 43. In essence, transistors 42, 44 provides SEU immunity for cross-coupled transistors 41, 43 via voltage division between nodes n1, n2 and $V_{dd}$. Similarly, transistors 47, 49 are much smaller in comparison to the cross-coupled transistors 48, 50. Thus, a significant amount of voltage can be dropped across each of transistors 47 and 49 with respect to cross-coupled transistors 48 and 50. Transistors 47, 49 provides SEU immunity for cross-coupled transistors 48, 50 via voltage division between nodes n1, n2 and ground. As a result, the sensitive storage nodes of SRAM cell 40 are protected. The exact relative ratio between transistors 42, 44, 47, 49 and the remaining transistors depends on the supply voltage $V_{dd}$ and the threshold voltage of the transistors.

SRAM cell 40 is hardened from SEUs via two voltage divisions. A first voltage division is provided between isolation transistors 42, 44 and cross-coupled transistors 41, 43 during a particle strike by connecting isolation transistors 42, 44 and cross-coupled transistors 41, 43 between storage nodes n1, n2 and power supply $V_{dd}$. A second voltage division is provided between isolation transistors 47, 49 and cross-coupled transistors 48, 50 during a particle strike by connecting isolation transistors 47, 49 and cross-coupled transistors 48, 50 between storage nodes n1, n2 and ground.

Figure 5:
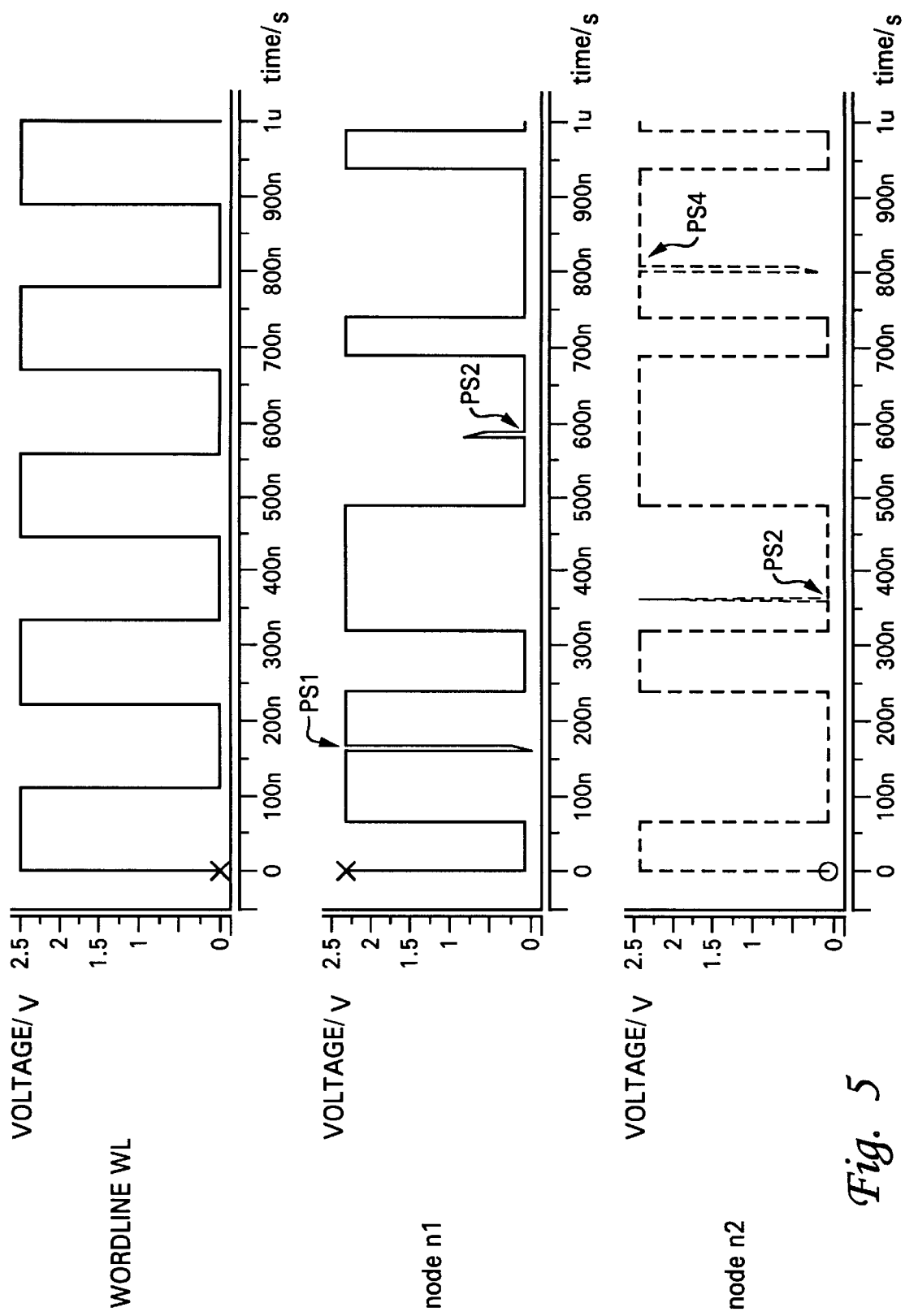
FIG. 5 is a graphical illustration of the simulation results of particle strikes on the SRAM cell from FIG. 4.

Referring now to FIG. 5, the simulation results of particle strikes on SRAM cell 40 from FIG. 4 are illustrated. During the simulation, four particle strike events ps1–ps4 separately occurred at node n1, node n2, node n3, and node n4 of SRAM cell 40. All four particle strike events ps1–ps4 occurred when wordline WL was not asserted because this is the time when SRAM cell 40 is most susceptible to SEUs caused by particle strikes. The simulation results indicates that during a particle strike at one node of SRAM cell 40, the complementary node is not affected by the particle strike. For example, node n2 maintains its state during particle strike event ps1 at node n1; and similarly, node n1 maintains its state during particle strike event ps2 at node n2. The simulation results further indicates that the effects on node n1 and node n2 during separate particle strike events at node n3 and node n4. For example, when a particle strikes at node n3, the effect is felt at node n1 in the form of particle strike event ps3, but node n2 maintains its state; and similarly, when a particle strikes at node n4, the effect is felt at node n2 in the form of particle strike event ps4, but node n1 maintains its state.

Figure 6:
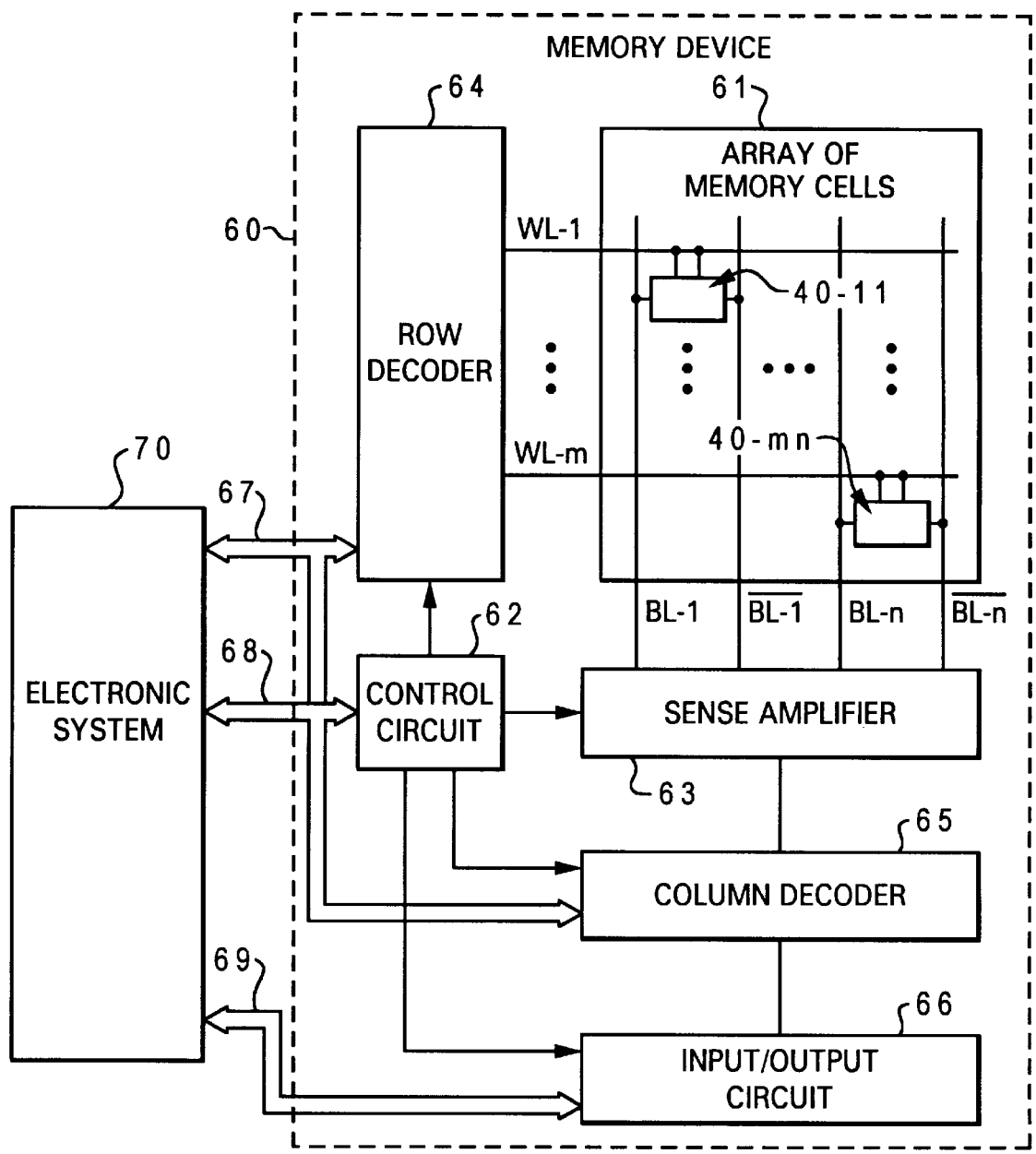
FIG. 6 is a block diagram of an apparatus in which a preferred embodiment of the present invention may be incorporated.

As has been described, the present invention provides a SEU-hardened memory cell to be utilized in SRAMs. The present invention may be implemented in a variety of apparatuses having an SRAM. For example, with reference now to FIG. 6, there is depicted a block diagram of an apparatus in which a preferred embodiment of the present invention may be incorporated. As shown, the apparatus includes an electronic system 70 coupled to a memory device 60. Electronic system 70 may be, for example, a processor, a memory controller, a chip set or any system that stores data in a memory device such as memory device 60. Electronic system 70 is coupled to a row decoder 64 and a column decoder 65 of memory device 60 via address lines 67. Electronic system 70 is also coupled to a control circuit 62 of memory device 60 via control lines 68. In addition, electronic system 70 is coupled to an input/output circuit 66 of memory device 60 via input/output lines 69.

Memory device 60 includes a sense amplifier 63 and a memory cell array 61. Array 61 includes a number of wordlines, WL-1 through WL-m, and a number of bit line pairs, BL-1 through BL-n (and $\overline{\text{BL}}$-1 through $\overline{\text{BL}}$-n). Array 61 is constructed to use a memory cell sensing scheme such that each bit line pair is to be used in reading and writing data into a SRAM cell such as SRAM cell 40-11. Memory device 60 is controlled by control circuit 62. Control circuit 62 is coupled to row decoder 64, column decoder 65, input/output circuit 66, and sense amplifier 63.

Memory device 60 reads and writes data for electronic system 70. For example, in order to read a value from SRAM cell 40-11 in a read operation, electronic system 70 provides the address of SRAM cell 40-11 to row decoder 64 over address lines 67. Electronic system 70 also provides control signals to control circuit 62 over control lines 68. Control circuit 62 provides signals to sense amplifier 63 that causes an equilibrate circuit (not shown) within sense amplifier 63 to equilibrate the voltages on bit lines BL-1 and $\overline{\text{BL}}$-1. The equilibrate circuit of sense amplifier 63 forces bit lines BL-1 and $\overline{\text{BL}}$-1 to a common voltage; for example, $V_{dd}-V_t$. It is noted that the voltage range between the high and low logic levels for sense amplifier 63 differs from that of SRAM cell 40-11.

With the charge on bit line pair, sense amplifier 63 next detects the logic state of SRAM cell 40-11. Column decoder 65 receives the column address of the selected cell from electronic system 70. Column decoder 65 identifies the appropriate bit line pair for sense amplifier 63 to use in reading the value from SRAM cell 40-11. Sense amplifier 63 senses and amplifies the differential voltage across the bit line pair and thus produces high and low logic levels on complementary nodes of sense amplifier 63 that correspond to the states of sensed bit line pair. These voltage levels are passed to electronic system 70 by input/output circuit 66 via input/output lines 69.

In a write operation, electronic system 70 provides data to be written to, for example, SRAM cell 40-11 over input/output lines 69 to input/output circuit 67. Column decoder 65 receives the column address from electronic system 70 via address lines 67 to select the appropriate bit line pair for the selected SRAM cell. Sense amplifier 63, under the control of control circuit 62, forces the bit line pair for SRAM cell 40-11 to complementary high and low logic levels based on the data to be stored in SRAM cell 40-11. Row decoder 64 receives an address from electronic system 70 over address line 67 that indicates the appropriate wordline to activate for this store operation. In this process, the high and low logic levels for sense amplifier 63 are translated to appropriate voltage levels for SRAM cell 40-11.

While the invention has been particularly shown and described with reference to a preferred embodiment, it will be understood by those skilled in the art that various changes in form and detail may be made therein without departing from the spirit and scope of the invention.

What is claimed is:

1. A single event upset hardened bi-stable circuit, comprising:

a first set of two cross-coupled transistors and a second set of two cross-coupled transistors, wherein said cross-coupling is accomplished by connecting a gate of each transistor to a drain of another transistor in a same set; and a first set of isolation transistors and a second set of isolation transistors, wherein said first and second sets of isolation transistors are respectively connected to said first and second sets of cross-coupled transistors such that two inversion paths are formed including said two sets of cross-coupled transistors and said two sets of isolation transistors.

2. The circuit according to claim 1, wherein said first set of cross-coupled transistors includes two p-channel transistors.

3. The circuit according to claim 1, wherein said second set of cross-coupled transistors includes two n-channel transistors.

4. The circuit according to claim 1, wherein said first set of isolation transistors includes two p-channel transistors having their gate connected to a low voltage.

5. The circuit according to claim 4, wherein said low voltage is ground.

6. The circuit according to claim 1, wherein said second set of isolation transistors includes two n-channel transistors having their gate connected to a high voltage.

7. The circuit according to claim 6, wherein said high voltage is a voltage from a power supply.

8. A single event upset hardened bi-stable circuit, comprising:
   a first transistor cross-coupled to a second transistor;
   a third transistor cross-coupled to a fourth transistor;
   a first isolation and a second isolation transistors connected in series between said first transistor and said third transistor to form a first inversion path with said second transistor and said fourth transistor;
   a third isolation and fourth isolation transistors connected in series between said second transistor and said fourth transistor to form a second inversion path with said first transistor and said third transistor.

9. The circuit according to claim 8, wherein said first transistor and said second transistor are p-channel transistors.

10. The circuit according to claim 8, wherein said third transistor and said fourth transistor are n-channel transistors.

11. The circuit according to claim 8, wherein each of said first and third isolation transistors is a p-channel transistor having its gate connected to a low voltage, wherein each of said second and fourth isolation transistor is an n-channel transistor having its gate connected to a high voltage.

12. The circuit according to claim 11, wherein said low voltage is ground and said high voltage is a voltage from a power supply.

13. A single event upset hardened bi-stable circuit, comprising:
   a first transistor, a second transistor, a third transistor, and a fourth transistor connected in series; and
   a fifth transistor, a sixth transistor, a seventh transistor, and an eighth transistor connected in series, wherein a gate of said third transistor and said seventh transistor is connected to a high voltage and a gate of said second transistor and said sixth transistor is connected to a low voltage, wherein a gate of said first transistor is connected to a node between said fifth transistor and said sixth transistor, wherein a gate of said fifth transistor is connected to a node between said first transistor and said second transistor, wherein a gate of said fourth transistor is connected to a node between said seventh transistor and said eighth transistor, wherein a gate of said eighth transistor is connected to a node between said third transistor and said fourth transistor.

14. The circuit according to claim 13, wherein a source of said first transistor is connected to said high voltage and a source of said fourth transistor is connected to said low voltage.

15. The circuit according to claim 14, wherein said high voltage is a voltage from a power supply and said low voltage is ground.

16. The circuit according to claim 13, wherein a source of said fifth transistor is connected to a high voltage and a source of said eighth transistor is connected to a low voltage.

17. The circuit according to claim 16, wherein said high voltage is a voltage from a power supply and said low voltage is ground.

18. The circuit according to claim 13, wherein said first transistor, said second transistor, said fifth transistor, and said sixth transistor are p-channel transistors.

19. The circuit according to claim 13, wherein third transistor, said fourth transistor, said seventh transistor, and said eighth transistor are n-channel transistors.

20. A memory device, comprising:
   a sense amplifier;
   an addressing circuitry having a row decoder and a column decoder;
   an array of wordlines and complementary bit line pairs, coupled to said sense amplifier and said addressing circuitry;
   a plurality of memory cells located at an intersection of each of said wordlines and said bit line pairs, wherein each of said plurality of memory cells has a single event upset hardened bi-stable circuit that includes:
      a first set of two cross-coupled transistors and a second set of two cross-coupled transistors, wherein said cross-coupling is accomplished by connecting a gate of each transistor to a drain of another transistor in a same set; and
      a first set of isolation transistors and a second set of isolation transistors, wherein said first and second sets of isolation transistors are respectively connected to said first and second sets of cross-coupled transistors such that two inversion paths are formed including said two sets of cross-coupled transistors and said two sets of isolation transistors.

21. The memory device according to claim 20, wherein said first set of cross-coupled transistors includes two p-channel transistors.

22. The memory device according to claim 20, wherein said second set of cross-coupled transistors includes two n-channel transistors.

23. The memory device according to claim 20, wherein said first set of isolation transistors includes two p-channel transistors having their gate connected to a low voltage.

24. The memory device according to claim 23, wherein said low voltage is ground.

25. The memory device according to claim 20, wherein said second set of isolation transistors includes two n-channel transistors having their gate connected to a high voltage.

26. The memory device according to claim 25, wherein said high voltage is a voltage from a power supply.

27. An apparatus, comprising:
   an electronic system; and
   a memory device having a plurality of memory cells, wherein each of said plurality of memory cells has a single event upset hardened bi-stable circuit that includes:
      a first set of two cross-coupled transistors and a second set of two cross-coupled transistors, wherein said cross-coupling is accomplished by connecting a gate of each transistor to a drain of another transistor in a same set; and
      a first set of isolation transistors and a second set of isolation transistors, wherein said first and second sets of isolation transistors are respectively connected to said first and second sets of cross-coupled transistors such that two inversion paths are formed including said two sets of cross-coupled transistors and said two sets of isolation transistors.

28. The apparatus according to claim 27, wherein said first set of cross-coupled transistors includes two p-channel transistors.

29. The apparatus according to claim 27, wherein said second set of cross-coupled transistors includes two n-channel transistors.

30. The apparatus according to claim 27, wherein said first set of isolation transistors includes two p-channel transistors having their gate connected to a low voltage.

31. The apparatus according to claim 30, wherein said low voltage is ground.

32. The apparatus according to claim 27, wherein said second set of isolation transistors includes two n-channel transistors having their gate connected to a high voltage.

33. The apparatus according to claim 32, wherein said high voltage is a voltage from a power supply.

34. The apparatus according to claim 27, wherein said electronic system is a processor.

35. The apparatus according to claim 27, wherein said electronic system is a memory controller.

* * * * *